(12) United States Patent
Saito et al.

(10) Patent No.: US 8,203,172 B2
(45) Date of Patent: Jun. 19, 2012

(54) NITRIDE SEMICONDUCTOR DEVICE

(75) Inventors: Wataru Saito, Kanagawa-ken (JP); Yasunobu Saito, Tokyo (JP); Takao Noda, Kanagawa-ken (JP); Hidetoshi Fujimoto, Kanagawa-ken (JP); Tetsuya Ohno, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 182 days.

(21) Appl. No.: 12/757,528

(22) Filed: Apr. 9, 2010

(65) Prior Publication Data
US 2010/0314666 A1    Dec. 16, 2010

(30) Foreign Application Priority Data
Jun. 11, 2009  (JP) ................. 2009-140361

(51) Int. Cl.
*H01L 29/10* (2006.01)
*H01L 29/205* (2006.01)

(52) U.S. Cl. . 257/192; 257/194; 257/201; 257/E29.043; 257/E29.049; 257/E29.05; 257/E29.06; 257/E29.061; 257/E29.09; 257/E29.091

(58) Field of Classification Search .................. 257/192, 257/194, 201, E29.043, E29.049, E29.05, 257/E29.06, E29.061, E29.09, E29.091
See application file for complete search history.

(56) References Cited

U.S. PATENT DOCUMENTS

| | | | | |
|---|---|---|---|---|
| 5,111,430 A | * | 5/1992 | Morie | 365/185.24 |
| 7,038,252 B2 | * | 5/2006 | Saito et al. | 257/192 |
| 7,508,015 B2 | * | 3/2009 | Saito et al. | 257/192 |
| 2005/0062069 A1 | | 3/2005 | Saito et al. | |
| 2005/0189559 A1 | * | 9/2005 | Saito et al. | 257/189 |
| 2006/0138454 A1 | * | 6/2006 | Saito et al. | 257/192 |
| 2008/0277692 A1 | * | 11/2008 | Saito et al. | 257/192 |

FOREIGN PATENT DOCUMENTS

JP    2007-180143 A    7/2007

OTHER PUBLICATIONS

Seung-Chul Lee et al., "A New Vertical GaN Schottky Barrier Diode with Floating Metal Ring for High Breakdown Voltage"; Proceeding of 2004 International Symposium on Power Semiconductor Devices & ICs, Kitakyushu pp. 319-322.

Min-Woo Ha et al.; "AlGaN/GaN High-Electron-Mobility Transistor Employing an Additional Gate for High-Voltage Switching Applications"; Japanese J. of Appl. Phy., vol. 44, No. 9A, pp. 6385-6388, Sep. 2005.

* cited by examiner

*Primary Examiner* — Victor A Mandala
(74) *Attorney, Agent, or Firm* — Patterson & Sheridan, LLP

(57) ABSTRACT

A nitride semiconductor device includes: a first layer made of a first nitride semiconductor; a second layer provided on the first layer and made of a second nitride semiconductor having a larger band gap than the first nitride semiconductor; a first electrode electrically connected to the second layer; a second electrode provided on the second layer and juxtaposed to the first electrode in a first direction; and a floating electrode provided on the second layer, the floating electrode including: a portion sandwiched by the second electrode in a second direction orthogonal to the first direction; and a portion protruding from the second electrode toward the first electrode.

12 Claims, 8 Drawing Sheets

A-A CROSS SECTION

B-B CROSS SECTION

A-A CROSS SECTION

B-B CROSS SECTION

A-A CROSS SECTION

B-B CROSS SECTION

NITRIDE SEMICONDUCTOR DEVICE

CROSS-REFERENCE TO RELATED APPLICATIONS

This application is based upon and claims the benefit of priority from the prior Japanese Patent Application No. 2009-140361, filed on Jun. 11, 2009; the entire contents of which are incorporated herein by reference.

BACKGROUND

Embodiments of the invention relate generally to a nitride semiconductor device.

Switching devices for use in power control are required to have a low ON resistance and a high breakdown voltage. On the other hand, semiconductor switching devices exhibit a trade-off, which decreasing the ON resistance causes a decrease in breakdown voltage, and have a breakdown voltage limit unique to the semiconductor material to be used to a desired ON resistance.

Since nitride semiconductors such as GaN have a larger band gap than Si, the trade-off of the ON resistance and the breakdown voltage unique to the material can be drastically improved. Therefore, switching devices made of a nitride semiconductor are expected to achieve a high breakdown voltage at a low ON resistance as compared with conventional switching devices made of Si. A field effect transistor using heterojunction (HFET: heterojunction field effect transistor) of n-AlGaN and i-GaN and a Schottky barrier diode (SBD) using GaN are regarded as promising switching devices made of a nitride semiconductor. (JP-A 2007-180143 (Kokai); Japanese Journal of Applied Physics Vol. 44, No. 9A, 2005, pp. 6385-6388; and Proceeding of 2004 International Symposium on Power Semiconductor Devices & ICs, pp. 319-322)

On the other hand, as well as resisting to application of a high voltage, devices used for power control are required to protect passive devices, other switching devices, and the like in a circuit by clamping a voltage in order to prevent the voltage applied to subsequent stage circuits from becoming excessively large in the case where the applied voltage is overlapped with noise and becomes an overvoltage. In other words, passing a certain level of current to clamp the voltage against the overvoltage is an essential function.

However, in switching devices made of a nitride semiconductor, when a high voltage is applied to cause avalanche breakdown, a trouble occurs in which an overcurrent readily flows to lead to destruction of the device. That is, there has been the problem that a voltage clamp function utilizing a current generated by avalanche breakdown cannot be provided.

SUMMARY

According to an aspect of the invention, there is provided a nitride semiconductor device including: a first layer made of a first nitride semiconductor; a second layer provided on the first layer and made of a second nitride semiconductor having a larger band gap than the first nitride semiconductor; a first electrode electrically connected to the second layer; a second electrode provided on the second layer and juxtaposed to the first electrode in a first direction; and a floating electrode provided on the second layer, the floating electrode including: a portion sandwiched by the second electrode in a second direction orthogonal to the first direction; and a portion protruding from the second electrode toward the first electrode.

According to another aspect of the invention, there is provided a nitride semiconductor device including: a first layer made of a first nitride semiconductor; a second layer provided on the first layer and made of a second nitride semiconductor having a larger band gap than the first nitride semiconductor; a first electrode electrically connected to the second layer; a second electrode provided on the second layer and juxtaposed to the first electrode in a first direction; a third electrode electrically connected to the second layer, juxtaposed to the first electrode and the second electrode in the first direction, and provided at a position sandwiching the second electrode with a distance along with the first electrode; and a floating electrode provided on the second layer, the floating electrode including: a portion sandwiched by the second electrode in a second direction orthogonal to the first direction; and a portion protruding from the second electrode toward the first electrode.

DETAILED DESCRIPTION

Figure 1A:
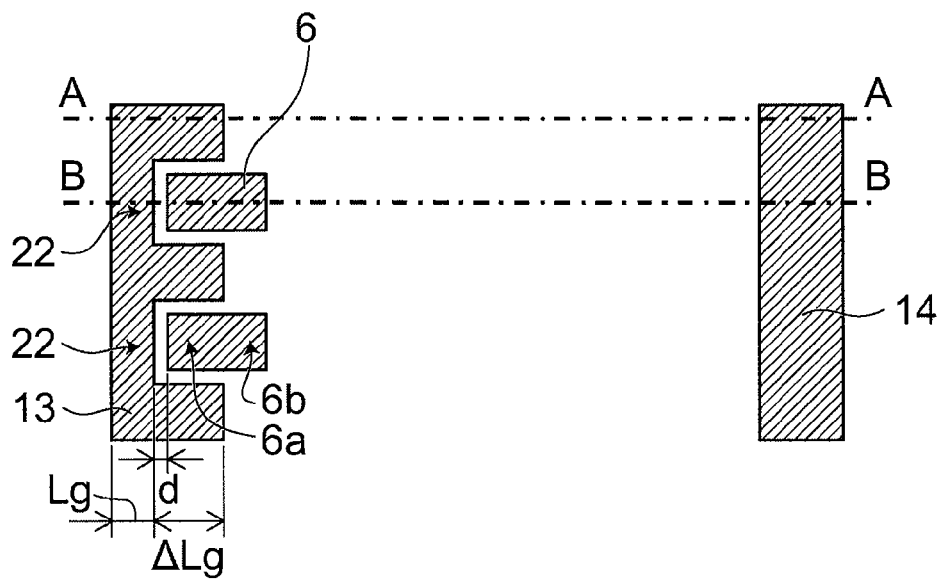
FIGS. 1A to 1C are an electrode pattern view and cross-sectional views schematically illustrating the configuration of a nitride semiconductor SBD according to a first embodiment of the invention.

Embodiments of the invention will now be described with reference to the drawings. In the following embodiments, identical portions in the drawings are marked with the same reference numerals and a detailed description thereof is omitted as appropriate; and distinctive features are described as appropriate.

First Embodiment

Figure 1B:
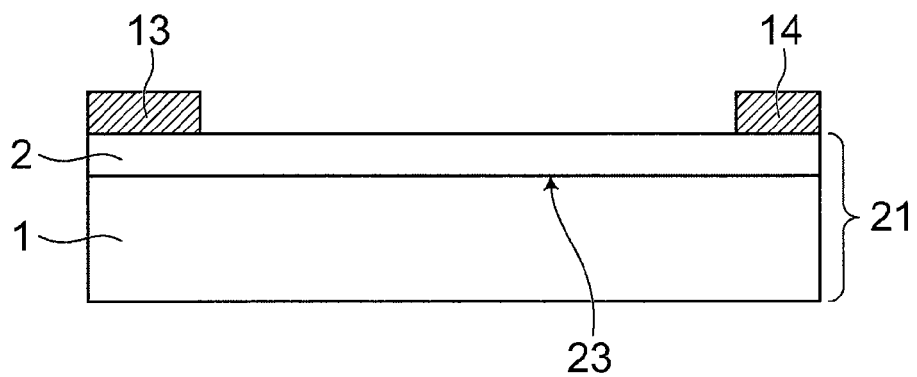
Figure 1C:
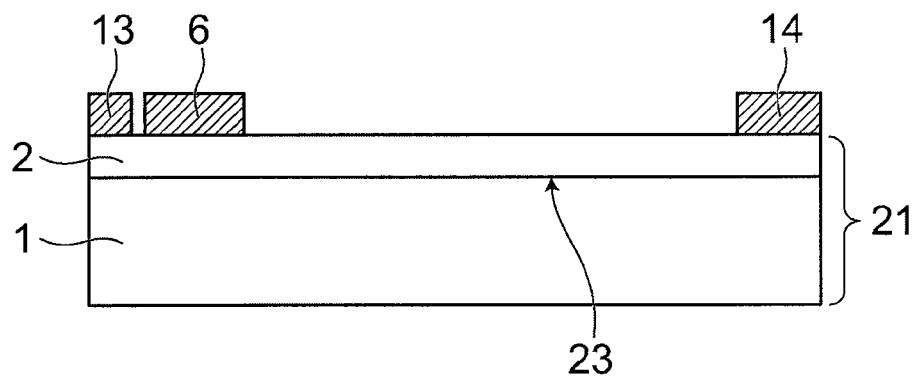

FIGS. 1A to 1C are schematic views illustrating the configuration of a nitride semiconductor SBD according to a first embodiment of the invention. FIG. 1A is a schematic view illustrating the electrode pattern of the SBD, and FIGS. 1B and 1C are schematic views illustrating the A-A cross section and the B-B cross section of the SBD, respectively.

The nitride semiconductor SBD according to this embodiment includes: an i-GaN layer 1 that is a first layer made of a first nitride semiconductor; an i-AlGaN layer 2 that is provided on the i-GaN layer 1 and is a second layer made of a second nitride semiconductor having a larger band gap than GaN; a cathode electrode 14 that is a first electrode electrically connected to the i-AlGaN layer 2; an anode electrode 13 that is provided on the i-AlGaN layer 2 and is a second electrode juxtaposed to the cathode electrode 14 in a first direction; and floating electrodes 6 provided on the i-AlGaN layer 2.

Further, the floating electrode 6 includes: a portion 6a sandwiched by the anode electrode 13 in a second direction orthogonal to the first direction; and a portion 6b protruding from the anode electrode 13 toward the cathode electrode 14. In FIG. 1A, the first direction refers to the horizontal direction in the drawing and the second direction refers to the vertical direction.

Next, details of the configuration mentioned above are described. The cathode electrode 14 formed on a nitride semiconductor substrate 21 in which the i-GaN layer 1 and the i-AlGaN layer 2 are stacked is electrically connected to the upper face of the i-AlGaN layer 2. That is, an ohmic contact is formed between the cathode electrode 14 and the i-AlGaN layer 2. On the other hand, the anode electrode 13 provided at a position opposed to the cathode electrode 14 forms a Schottky contact with the i-AlGaN layer 2.

Although the i-GaN layer 1 and the i-AlGaN layer 2 according to this embodiment are undoped high resistive layers, this embodiment can be practiced also by using an n-AlGaN layer made by n-type-doping the i-AlGaN layer 2. Furthermore, an i-AlGaN layer having a smaller band gap than the i-AlGaN layer 2 may be used in place of the i-GaN layer 1.

At the time of the ON operation of the SBD, the Schottky contact of the anode electrode 13 is forward biased to pass a current from the anode electrode 13 to the cathode electrode 14 via a channel 23 formed at the hetero-interface between the i-GaN layer 1 and the i-AlGaN layer 2. On the other hand, at the hetero-interface between the i-GaN layer 1 and the i-AlGaN layer 2, electrons are supplied from the i-AlGaN layer 2 functioning as a barrier layer to the i-GaN layer 1 side to produce high-concentration two-dimensional electron gas. Thereby, the channel 23 becomes low resistive, and a low ON resistance can be achieved.

Furthermore, as illustrated in the electrode pattern of FIG. 1A, the anode electrode 13 includes a short electrode portion 22 in which the electrode length in the direction opposed to the cathode electrode 14 is relatively shortened. Furthermore, the floating electrode 6 is provided at a position close to the short electrode portion 22 between the anode electrode 13 and the cathode electrode 14. At the time of the OFF operation of the SBD, when a reverse bias is applied between the anode electrode 13 and the cathode electrode 14, the floating potential of the floating electrode 6 that includes the portion 6b protruding from the anode electrode 13 toward the cathode electrode 14 changes in accordance with the bias voltage. At this time, when a certain level of high voltage lower than the breakdown voltage of the Schottky contact of the anode electrode 13 is applied, the potential barrier of the bottom of the anode electrode 13 close to the floating electrode 6 is pushed down to pass a current, and the voltage is thus clamped. In other words, forming the floating electrode 6 enables to provide the function of clamping the voltage at a voltage lower than the breakdown voltage of the SBD. The distance d between the floating electrode 6 and the anode electrode 13 is preferably made shorter than the electrode length Lg of the short electrode portion 22 in order to ensure the effect of the push down of the potential barrier of the anode electrode 13 by change in electric potential of the floating electrode 6. The floating electrode 6 preferably makes a Schottky contact with the i-AlGaN layer 2 in order to avoid becoming a leak current path.

As illustrated in FIG. 1A, the anode electrode 13 is formed in a comb shape in which the short electrode portions 22 form concaves. On the other hand, the floating electrode 6 is provided in the concave in a nesting form and has the portion 6a sandwiched by the anode electrode 13. Thereby, when the electric potential of the floating electrode 6 changes, since only the potential barrier of the short electrode portion 22 is pushed down, the current path during voltage clamping is limited to the surroundings of the short electrode portion 22, and an overcurrent that may lead to destruction of the device can be prevented. That is, the distance d between the floating electrode 6 and the anode electrode 13 (the short electrode portion 22) is preferably made shorter than the recess depth ΔLg of the concave of the anode electrode 13.

Second Embodiment

Figure 2A:
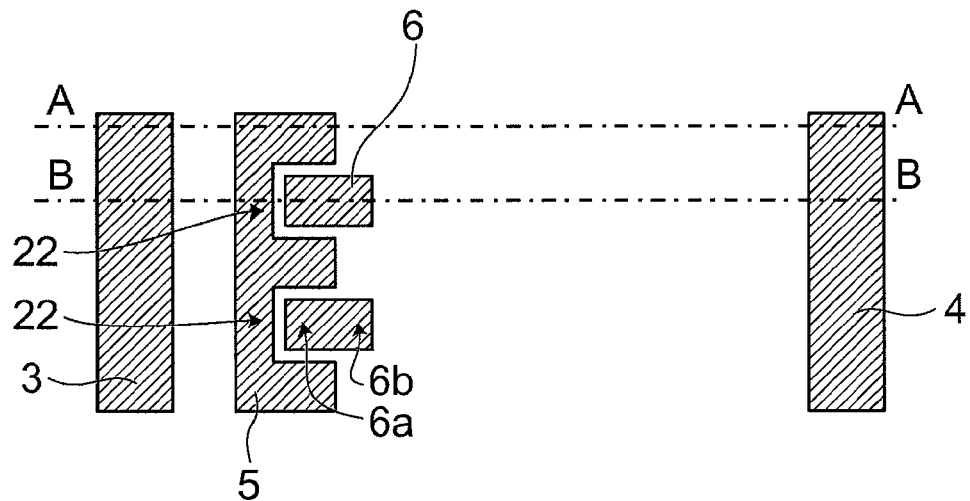
FIGS. 2A to 2C are an electrode pattern view and cross-sectional views schematically illustrating the configuration of a nitride semiconductor HFET according to a second embodiment of the invention.
Figure 2B:
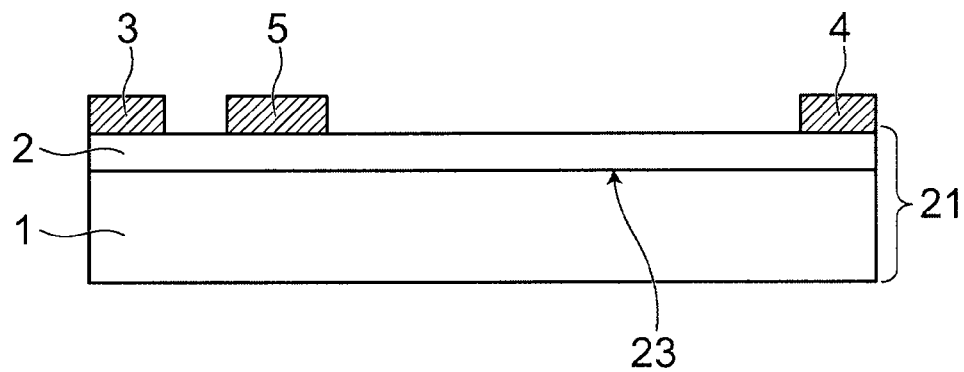
Figure 2C:
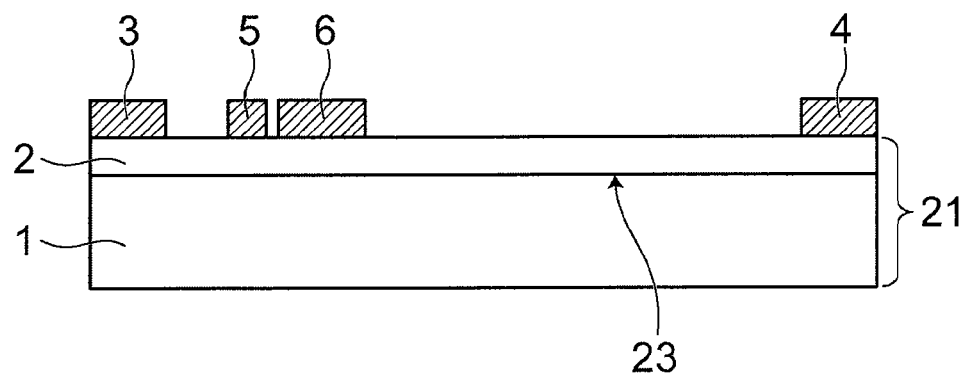

FIGS. 2A to 2C are an electrode pattern view and cross-sectional views schematically illustrating the configuration of a nitride semiconductor HFET according to a second embodiment of the invention. FIG. 2A is a schematic view illustrating the electrode pattern of the HFET, and FIGS. 2B and 2C are schematic views illustrating the A-A cross section and the B-B cross section of the HFET, respectively.

In the nitride semiconductor HFET illustrated in FIGS. 2A to 2C, a source electrode 3, a drain electrode 4, and a gate electrode 5 are formed. The source electrode 3 and the drain electrode 4 are electrically connected to the i-AlGaN layer 2 that is a barrier layer. The gate electrode 5 makes a Schottky contact with the i-AlGaN layer 2. The source electrode 3 is a third electrode and is juxtaposed to the drain electrode 4 that is the first electrode in the first direction. The gate electrode 5 that is the second electrode is provided between the source electrode 3 and the drain electrode 4. The gate length of the gate electrode 5 changes so as to include the short electrode portions 22 with a short gate length. On the other hand, the floating electrode 6 is provided close to the short electrode portion 22 and includes the portion 6a sandwiched by the gate electrode 5 in the second direction and the portion 6b protruding toward the drain electrode 4. Also in FIG. 2A, the first direction refers to the horizontal direction in the drawing, and the second direction refers to the vertical direction.

If the voltage applied between the gate electrode 5 and the source electrode 3 is not more than the gate threshold voltage, the channel 23 below the gate electrode 5 is depleted and the HFET is in an OFF state. At this time, when a voltage is applied between the source electrode 3 and the drain electrode 4, the electric potential of the floating electrode 6 changes in accordance with the drain voltage. If a certain level of high voltage lower than the breakdown voltage between source and drain is applied, the electric potential of the floating electrode 6 changes to lower the potential barrier of the short electrode portion 22, and two-dimensional electron gas is thus produced in the channel 23 to pass a current. Thereby, the voltage clamp function can be provided.

If a portion with a short gate length (the short electrode portion 22) is simply formed in the gate electrode 5, the function of passing a current during high voltage application can be provided due to short channel effects. However, in order to effectively function the voltage clamp, for example, it is required to increase the gap between the gate length of a portion that causes short channel effects and the gate length of a portion that does not cause short channel effects. Thus, the degree of freedom of design is limited. On the other hand, according to the configuration of this embodiment illustrated in FIGS. 2A to 2C, since the portion 6b formed in the floating electrode 6 to protrude from the gate electrode 5 toward the drain electrode 4 is close to the drain electrode 4, the potential of the floating electrode 6 is intensively controlled, and this enables effective functioning of the voltage clamp. That is, since the clamp voltage can be designed by changing the length of the floating electrode 6, the degree of freedom of design can be improved. Furthermore, it is possible to shorten the gate length of the portion that does not cause short channel effects, and the ON resistance can be thus reduced. Furthermore, the gate capacitance can be reduced by shortening the gate length, and this embodiment is effective also in enabling high-speed switching.

Furthermore, when a voltage is applied to the drain electrode 4, electric field concentration occurs not only at the end of the gate electrode 5 opposed to the drain electrode 4 but also at the end of the floating electrode 6 opposed to the drain electrode 4. Thus, the place where the electric field is concentrated is decentralized, and the effect of lowering the peak value of the concentrated electric field is obtained. As a result, this serves to suppress an ON resistance increase due to current collapse peculiar to nitride semiconductor HFETs and to suppress a characteristic variation such as a variation in gate threshold voltage and an increase in gate leak current, which allows to improve reliability.

Figure 3:
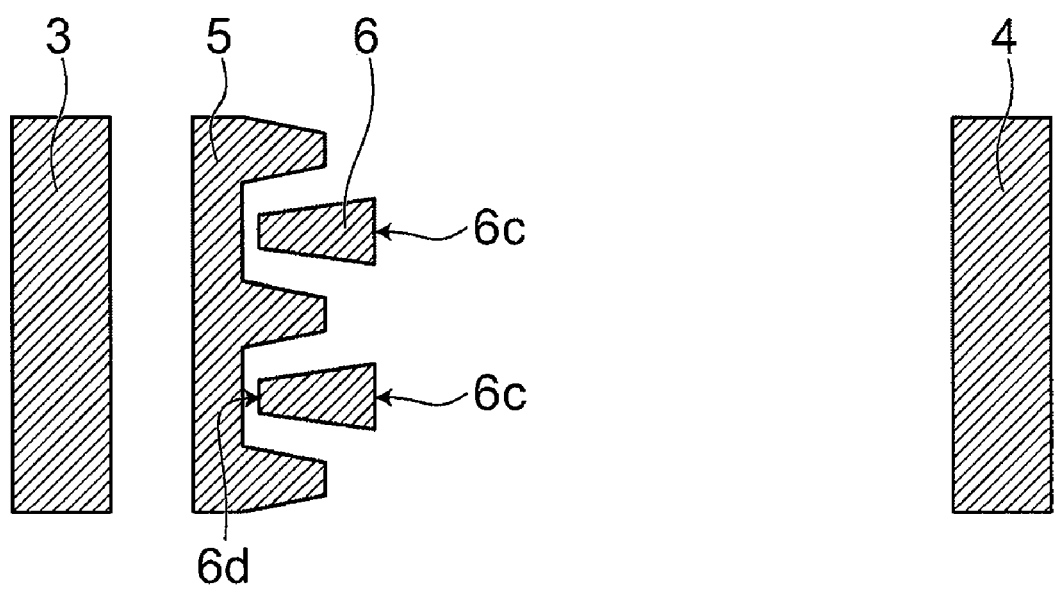
FIG. 3 is an electrode patten view of the nitride semiconductor HFET according to the second embodiment of the invention.

The comb-shaped electrode pattern illustrated in FIGS. 1A to 1C and FIGS. 2A to 2C has a rectangular staircase form. However, the gate length may be continuously changed, and for example, a configuration in which the portion with a long gate length is provided with a taper as illustrated in FIG. 3 may be used. In the electrode pattern illustrated in FIG. 3, the floating electrode 6 has a tapered shape corresponding to the shape of the gate electrode 5. Thereby, the coupling via the floating capacitance can be strengthened by a wide-width end 6c opposed to the drain electrode 4, whereas the current during voltage clamping can be limited by opposing a narrow-width end 6d to the gate electrode 5. That is, in those cases where a current excessively flows during voltage clamping in the embodiment illustrated in FIGS. 2A to 2C, this embodiment can reduce the current flowing during voltage clamping while maintaining the coupling with the drain electrode 4.

Figure 4A:
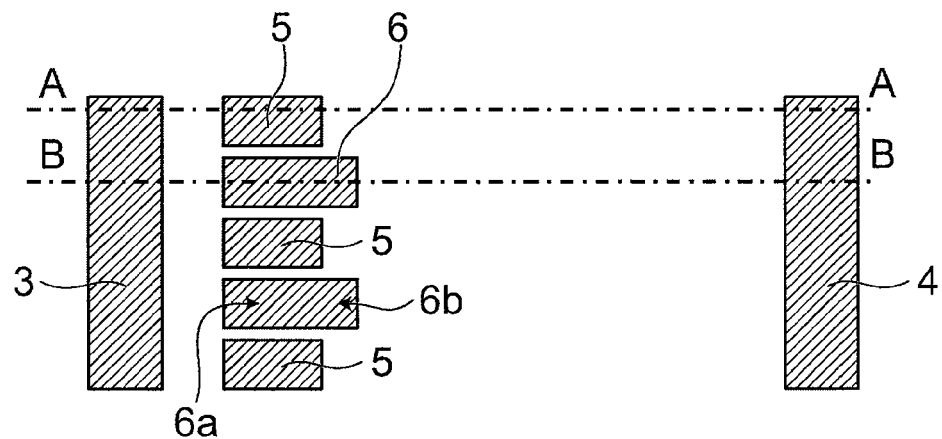
FIGS. 4A to 4C are an electrode pattern view and cross-sectional views schematically illustrating the configuration of a nitride semiconductor HFET according to the second embodiment of the invention.
Figure 4B:
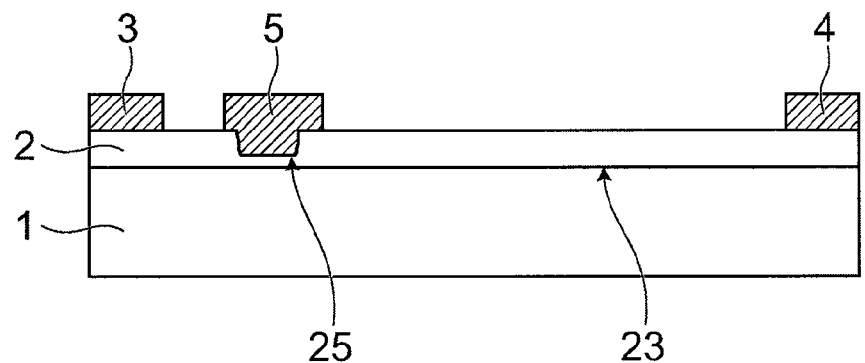
Figure 4C:
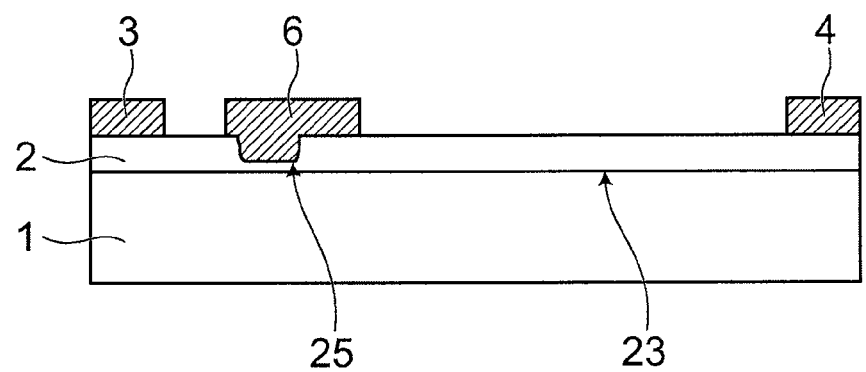

FIGS. 4A to 4C are an electrode pattern view and cross-sectional views schematically illustrating the configuration of a nitride semiconductor HFET according to a variation of the second embodiment. FIG. 4A is a schematic view illustrating the electrode pattern of the HFET, and FIGS. 4B and 4C are schematic views illustrating the A-A cross section and the B-B cross section of the HFET, respectively.

As illustrated in FIG. 4A, in this embodiment, a plurality of gate electrodes 5 are provided away from each other between the source electrode 3 and the drain electrode 4. The floating electrode 6 includes the portion 6a placed between the gate electrodes 5 and the portion 6b protruding from the gate electrode 5 toward the drain electrode 4. The plurality of gate electrodes 5 are connected by not-illustrated interconnections, and a common gate voltage is applied thereto during the operation of the HFET. Such an electrode pattern allows to reduce the gate capacitance and to provide high-speed switching characteristics.

On the other hand, as illustrated in FIGS. 4B and 4C, a recess 25 is formed in the i-AlGaN layer 2 under the gate electrode 5 and the floating electrode 6. In such a recess configuration, the channel 23 is depleted by the built-in potential of the Schottky barrier of the gate electrode 5 and the floating electrode 6, and a normally-off operation is obtained.

In the HFET illustrated in FIGS. 4A to 4C, when a voltage is applied between source and drain in the OFF state in which the gate bias is 0 V, the electric potential of the floating electrode 6 provided between the gate electrodes 5 changes in accordance with the drain voltage. As described above, if a certain level of drain voltage is applied, the potential barrier of the gate electrode 5 is lowered due to the electric potential of the floating electrode 6, and two-dimensional electron gas is produced in the depleted channel 23 to pass a current. In this embodiment, the current flows at the end of the gate electrode 5 adjacent to the portion 6a placed between the gate electrodes 5, and the voltage between source and drain is thus clamped. That is, the voltage clamp function can be provided also in this embodiment in which the gate electrode 5 does not exist between the floating electrode 6 and the source electrode 3. Furthermore, a normally-off operation of HFET can be obtained also by using a configuration in which the portion under the gate electrode 5 is selectively made a p-type layer, as well as by using the recess configuration mentioned above; and the embodiment mentioned above can be practiced also in this case.

In conventional nitride semiconductor HFETs that do not include the floating electrode 6, when a high voltage is applied between source and drain, the interior of the channel 23 becomes a high electric field to cause avalanche breakdown. The avalanche breakdown generates electron/hole pairs, and electrons accelerated by the electric field flow into the drain electrode 4. On the other hand, although holes move to the source electrode 3 side, since the resistance of the source contact formed in the i-AlGaN layer 2 or the n-AlGaN layer is high, the holes cannot rapidly flow into the source electrode 3 and are stored in the channel 23. The interior of the channel 23 in which the holes are stored becomes a still higher electric field to cause strong avalanche breakdown. Consequently, electron/hole pairs are further generated. Such cycle action results in destruction of the device even if high voltage application is momentary. In order to avoid such destruction, a p-layer that emits holes may be provided and connected to the source electrode 3. However, this imposes complicatedness on device structure and thus difficulty on design. Accordingly, it is effective to provide the function of clamping the voltage by the embodiments illustrated in FIGS. 2A to 4C in which the floating electrode 6 is added.

Third Embodiment

Figure 5A:
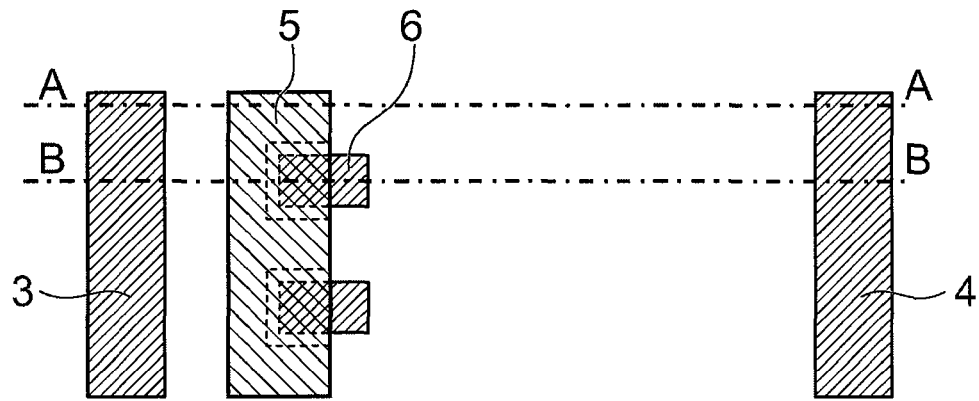
FIGS. 5A to 5C are an electrode pattern view and cross-sectional views schematically illustrating the configuration of a nitride semiconductor HFET according to a third embodiment of the invention.
Figure 5B:
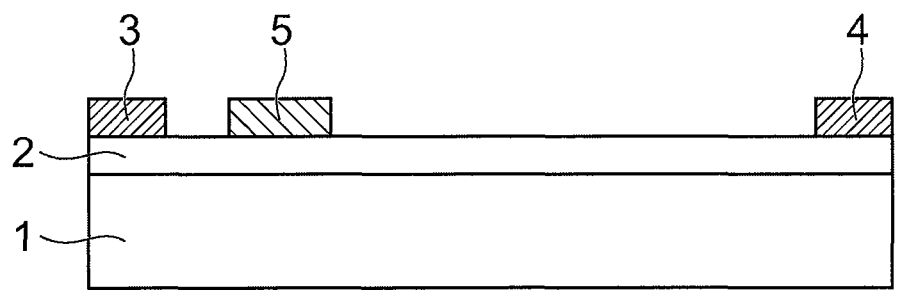
Figure 5C:
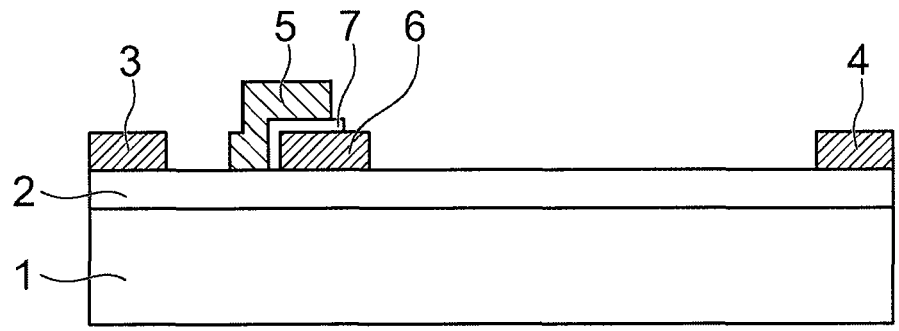

FIGS. 5A to 5C are an electrode pattern view and cross-sectional views schematically illustrating the configuration of a nitride semiconductor HFET according to a third embodiment of the invention. FIG. 5A is a schematic view illustrating the electrode pattern of the HFET, and FIGS. 5B and 5C are schematic views illustrating the A-A cross section and the B-B cross section of the HFET, respectively.

In the nitride semiconductor HFET according to this embodiment, as illustrated in FIGS. 5A and 5C, the gate electrode 5 that is the second electrode is formed so as to cover part of the floating electrode 6 via an insulating film 7. On the other hand, as illustrated in FIG. 5B, portions of the gate electrode 5 not overlapping with the floating electrode 6 are in contact with the i-AlGaN layer 2 to form a Schottky contact. The electric potential of the floating electrode 6 depends on the capacitance between the gate electrode 5 and the floating electrode 6 and the capacitance between the floating electrode 6 and the drain electrode 4. By the overlapping of the gate electrode 5 and the floating electrode 6 via the insulating film 7, the capacitance between the gate electrode 5 and the floating electrode 6 becomes large, and this facilitates the control of the clamp voltage.

Fourth Embodiment

Figure 6A:
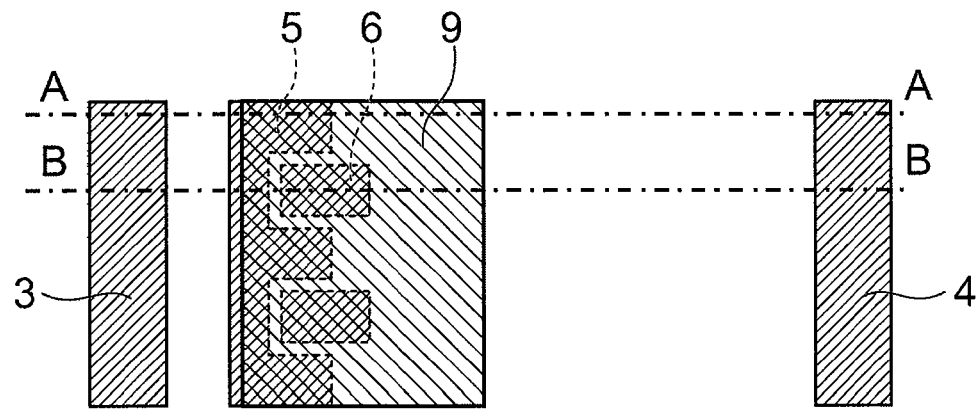
FIGS. 6A to 6C are an electrode pattern view and cross-sectional views schematically illustrating the configuration of a nitride semiconductor HFET according to a fourth embodiment of the invention.
Figure 6B:
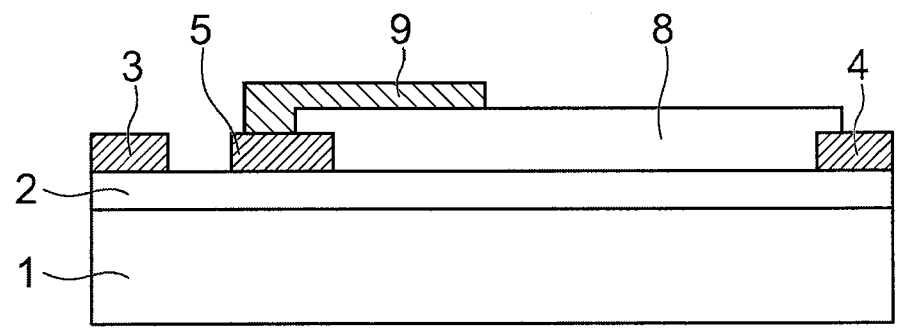
Figure 6C:
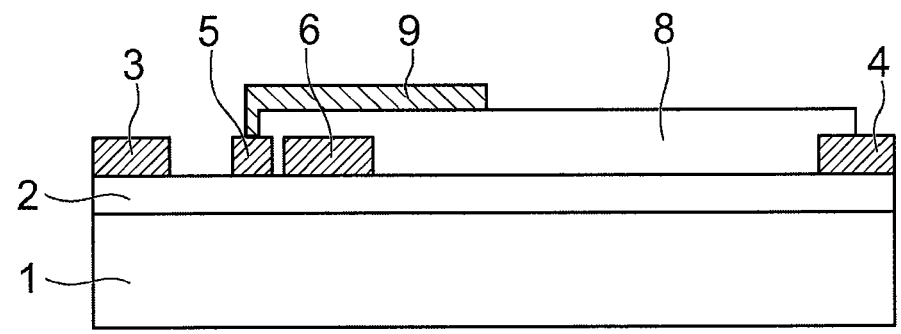

FIGS. 6A to 6C are an electrode pattern view and cross-sectional views schematically illustrating the configuration of a nitride semiconductor HFET according to a fourth embodiment of the invention. FIG. 6A is a schematic view illustrating the electrode pattern of the HFET, and FIGS. 6B and 6C are schematic views illustrating the A-A cross section and the B-B cross section of the HFET, respectively.

In the nitride semiconductor HFET according to this embodiment, as illustrated in FIGS. 6B and 6C, a first field insulating film 8 covering the floating electrode 6 and the surface of the AlGaN layer 2 is formed between the gate electrode 5 and the drain electrode 4. Furthermore, a first field plate electrode 9 that is connected to the gate electrode 5 and disposed so as to extend toward the drain electrode 4 on the first field insulating film 8 is formed. Thereby, the electric field concentration at the end of the gate electrode 5 opposed to the drain electrode 4 can be relaxed, and this suppresses an ON resistance increase due to current collapse, a variation in gate threshold voltage, and an increase in leak current. As described in the third embodiment, the capacitance between the gate electrode 5 and the floating electrode 6 is increased by the configuration in which the first field plate electrode 9 connected to the gate electrode 5 is formed so as to cover the floating electrode 6. Thus, this embodiment is effective also in facilitating the control of the clamp voltage.

Fifth Embodiment

Figure 7A:
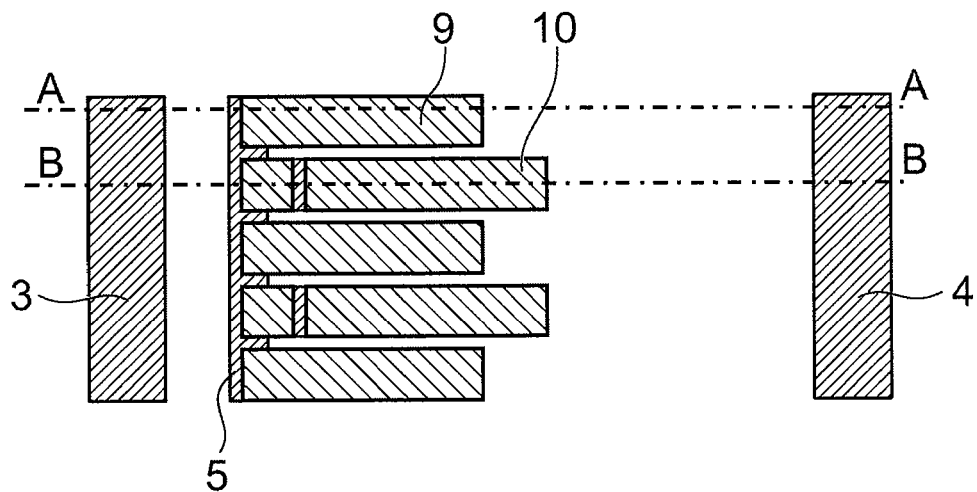
FIGS. 7A to 7C are an electrode pattern view and cross-sectional views schematically illustrating the configuration of a nitride semiconductor HFET according to a fifth embodiment of the invention.
Figure 7B:
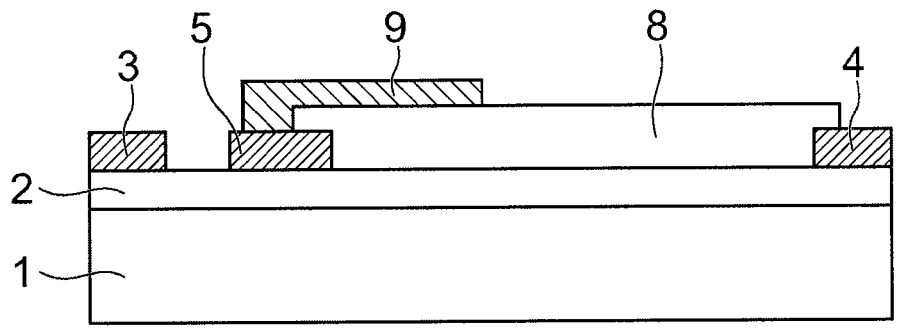
Figure 7C:
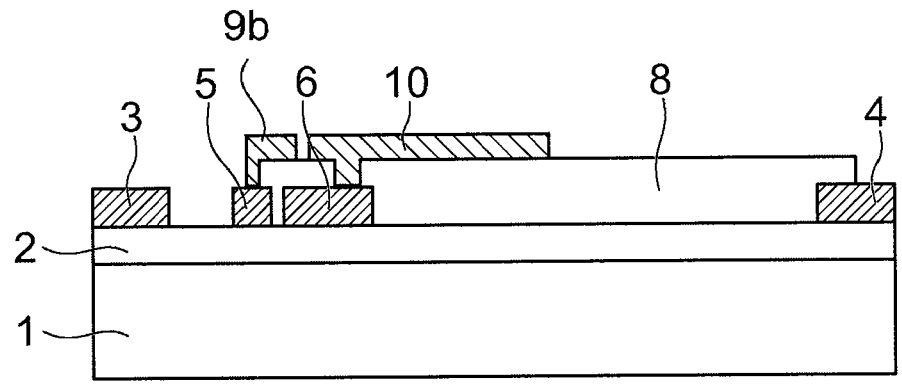

FIGS. 7A to 7C are an electrode pattern view and cross-sectional views schematically illustrating the configuration of a nitride semiconductor HFET according to a fifth embodiment of the invention. FIG. 7A is a schematic view illustrating the electrode pattern of the HFET, and FIGS. 7B and 7C are schematic views illustrating the A-A cross section and the B-B cross section of the HFET, respectively.

In the nitride semiconductor HFET according to this embodiment, as illustrated in FIG. 7B, the first field plate electrode 9 that is connected to the gate electrode 5 and disposed so as to extend toward the drain electrode 4 on the first field insulating film 8 is formed. Furthermore, as illustrated in FIGS. 7A and 7C, a second field plate electrode 10 that is formed away from the first field plate electrodes 9 and 9b and connected to the floating electrode 6 is disposed. The second field plate electrode 10 is disposed so as to extend from the floating electrode 6 toward drain electrode 4 on the first field insulating film 8.

Thereby, in addition to the effect of the first field plate electrode 9 described above, the effect of suppressing electric field concentration of the floating electrode 6 at the end opposed to the drain electrode 4 is obtained. That is, disposing the second field plate electrode 10 allows to suppress an ON resistance increase due to current collapse, a gate threshold voltage variation, and an increase in leak current. Furthermore, as illustrated in FIG. 7A, it is possible to lower the potential barrier near the floating electrode 6 surely by placing the second field plate electrode 10, which is connected to the floating electrode 6, closer to the drain electrode 4 than the first field plate electrode 9. This facilitates the control of the clamp voltage.

Figure 8A:
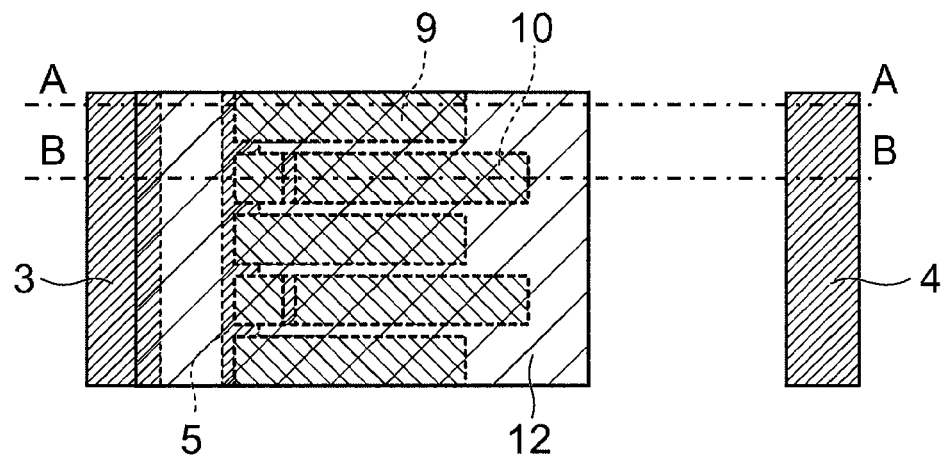
FIGS. 8A to 8C are an electrode pattern view and cross-sectional views schematically illustrating the configuration of a nitride semiconductor HFET according to the fifth embodiment of the invention.
Figure 8B:
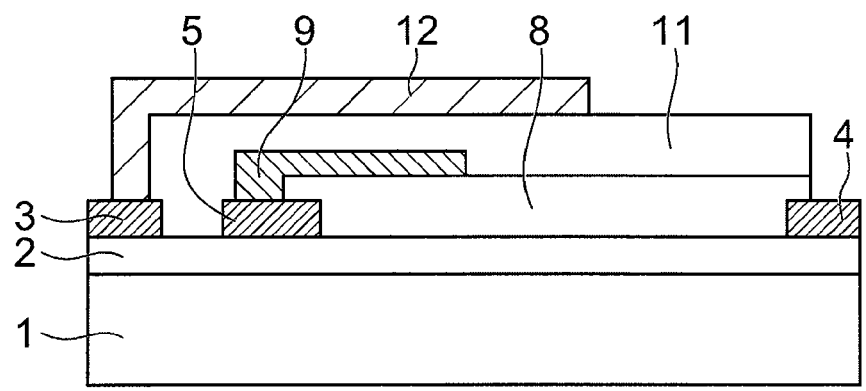
Figure 8C:
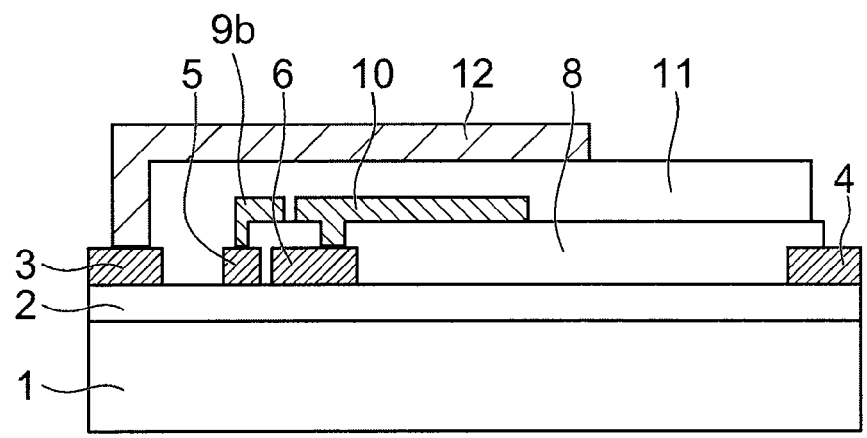

FIGS. 8A to 8C are an electrode pattern view and cross-sectional views schematically illustrating the configuration of a nitride semiconductor HFET according to a variation of the fifth embodiment. FIG. 8A is a schematic view illustrating the electrode pattern of the HFET, and FIGS. 8B and 8C are schematic views illustrating the A-A cross section and the B-B cross section of the HFET, respectively.

In the nitride semiconductor HFET according to this embodiment, in addition to the configuration illustrated in FIGS. 7A to 7C, a second field insulating film 11 is provided, and a third field plate electrode 12 connected to the source electrode is disposed on the second field insulating film 11, as illustrated in FIGS. 8B and 8C. This allows to suppress electric field concentration that occurs at the ends of the first and second field plate electrodes opposed to the drain electrode 4, and further suppress an ON resistance increase due to current collapse, a gate threshold voltage variation, and an increase in leak current.

Hereinabove, the first to fifth embodiments of the invention and the variations thereof are described. However, the invention is not limited to those embodiments. That is, in addition to them, all modifications readily apparent to technical experts in the art are included in the scope of the invention.

For example, although specific examples are illustrated in which a GaN layer is used as the channel layer and an AlGaN layer is used as the barrier layer, in addition to this, the invention can be practiced also by using a combination of other nitride semiconductors such as using an InGaN layer as the channel layer and a GaN layer as the barrier layer or using an AlGaN layer as the channel layer and an AlN layer as the barrier layer, or by using a combination of nitride semiconductor layers in which the ratio of components is changed to adjust band gap. Furthermore, the configurations of the gate electrode of HFET illustrated in FIGS. 3 to 7C can be also diverted to the anode electrode of HSBD illustrated in FIGS. 1A to 1C.

Generally, the gate threshold voltage of HFET is a minus, and HFETs are normally-on devices. Therefore, the embodiments mentioned above are applied in a state in which the gate voltage is applied on the minus side to perform voltage clamping. That is, the invention is practicable for both normally-off devices and normally-on devices irrespective of the gate threshold voltage. Furthermore, although descriptions are given by using an one-step source field plate structure to enhance the breakdown voltage of HFET, the invention is not limited thereto. The invention can be practiced also by using other structures for enhancing breakdown voltage such as a drain field plate structure, multistep field plate structure, and RESURF structure.

Moreover, the specific examples described above illustrate the case where the invention is applied to SBD and HFET, in addition to them, the invention is practicable also for any field effect devices using a nitride semiconductor such as MISHFET having an insulated gate structure, MESFET, and JFET, for example. In the case of using a MIS gate structure, it is preferable that the floating electrode is also formed on the gate insulating film in order to reduce leak current via the floating electrode. Furthermore, although a support substrate used in the course of forming the GaN layer and the AlGaN layer is not illustrated, the invention can be practiced by using a GaN substrate, SiC substrate, sapphire substrate, Si substrate, and the like, and the invention is not limited by the material of the support substrate.

In the specification of the application, a "nitride semiconductor" includes group III to V compound semiconductors of $B_xIn_yAl_zGa_{(1-x-y-z)}N$ ($0 \leq x \leq 1$, $0 \leq y \leq 1$, $0 \leq z \leq 1$, $0 \leq x+y+z \leq 1$); and the group V elements include also mixed crystals containing phosphorus (P), arsenic (As), and the like as well as N (nitrogen).

The invention claimed is:

1. A nitride semiconductor device comprising:
a first layer made of a first nitride semiconductor;
a second layer provided on the first layer and made of a second nitride semiconductor having a larger band gap than the first nitride semiconductor;
a first electrode electrically connected to the second layer;
a second electrode provided on the second layer and juxtaposed to the first electrode in a first direction;
a third electrode electrically connected to the second layer, juxtaposed to the first electrode and the second electrode in the first direction, and provided at a position sandwiching the second electrode with a distance along with the first electrode; and
a floating electrode provided on the second layer, the floating electrode including:
a portion sandwiched by the second electrode in a second direction orthogonal to the first direction; and
a portion protruding from the second electrode toward the first electrode.

2. The device according to claim 1, wherein the second electrode covers part of the floating electrode via an insulating film.

3. The device according to claim 1, further comprising:
a first field insulating film provided between the second electrode and the first electrode and covering the floating electrode and a surface of the second layer; and
a first field plate electrode connected to the second electrode and provided so as to extend toward the first electrode on the first field insulating film.

4. The device according to claim 3, wherein a space between the first field plate electrode and the first electrode is narrower than a space between the floating electrode and the first electrode.

5. The device according to claim 3, further comprising a second field plate electrode provided away from the first field plate electrode and connected to the floating electrode, the second field plate electrode being provided so as to extend from the floating electrode toward the first electrode on the first field insulating film.

6. The device according to claim 5, wherein a space between the second field plate electrode and the first electrode is narrower than a space between the first field plate electrode and the first electrode.

7. The device according to claim 5, further comprising:
a second field insulating film provided between the third electrode and the first electrode and covering the first field insulating film, the first field plate electrode, the second field plate electrode, and a surface of the second layer; and
a third field plate electrode connected to the third electrode and provided so as to extend toward the first electrode on the second field insulating film.

8. The device according to claim 1, wherein the second electrode forms a Schottky contact with the second layer.

9. The device according to claim 1, wherein a distance between the second electrode and the floating electrode in the first direction is shorter than a recess depth of a concave in the first direction, the concave being provided in the second electrode and sandwiching the floating electrode.

10. The device according to claim 1, wherein
a recess depth of a concave in the first direction changes continuously in the second direction, and
the floating electrode has a tapered shape,
the concave being provided in the second electrode and sandwiching the floating electrode,
a width of the tapered shape in the second direction increasing from the second electrode toward the first electrode.

11. The device according to claim 1, wherein the floating electrode forms a Schottky contact with the second layer.

12. The device according to claim 1, wherein a recess configuration in which the second layer is etched is provided at an interface between the second electrode and the floating electrode, and the second layer.

* * * * *